United States Patent
Mandelman et al.

[11] Patent Number: 5,981,332
[45] Date of Patent: Nov. 9, 1999

[54] REDUCED PARASITIC LEAKAGE IN SEMICONDUCTOR DEVICES

[75] Inventors: Jack A. Mandelman, Stormville; Louis L. C. Hsu, Fishkill; Johann Alsmeier, Wappingers Falls, all of N.Y.; William R. Tonti, Essex Junction, Vt.

[73] Assignees: Siemens Aktiengesellschaft, Munich, Germany; International Business Machines Corporation, Armonk, N.Y.

[21] Appl. No.: 08/940,237

[22] Filed: Sep. 30, 1997

[51] Int. Cl.$^6$ ............................................. H01L 21/8242
[52] U.S. Cl. ........................ 438/246; 438/242; 438/243; 438/526
[58] Field of Search ............................. 257/297; 438/242, 438/243, 244, 246, 247, 248, 249, 526, 712

[56] References Cited

U.S. PATENT DOCUMENTS

| | | |
|---|---|---|
| 5,185,284 | 2/1993 | Motonami ................................. 437/52 |
| 5,234,856 | 8/1993 | Gonzalez ................................. 438/244 |
| 5,334,547 | 8/1994 | Nakamura ................................. 437/52 |
| 5,543,348 | 8/1996 | Hammerl et al. ........................ 437/60 |
| 5,741,738 | 4/1998 | Mandelman et al. .................... 438/296 |

OTHER PUBLICATIONS

L. Nesbit et al., A 0.6 micron^2 256Mb Trench DRAM Cell with Self–Aligned BuriEd STap (BEST), IEDM 93–627, 1993.

S. Wolf et al., Silicon Processing for the VLSI Era, vol. 1, Lattice Press, p. 541, 1986.

S. Wolf, Silicon Processing for the VLSI Era, vol. 2, Lattice Press, pp. 18, 19, 301, 331, 333, and 661, 1990.

K. Ng, Complete Guide to Semiconductor Devices, McGraw–Hill, Inc., pp. 4, 164, and 165, 1995.

*Primary Examiner*—Olik Chaudhuri
*Assistant Examiner*—Daniel H. Mao
*Attorney, Agent, or Firm*—Stanton C. Braden

[57] ABSTRACT

A trench capacitor having a diffusion region adjacent to the collar to increase the gate threshold voltage of the parasitic MOSFET. This enables the use of a thinner collar while still achieving a leakage that is acceptable. In one embodiment, the diffusion region is self-aligned.

12 Claims, 4 Drawing Sheets

REDUCED PARASITIC LEAKAGE IN SEMICONDUCTOR DEVICES

FIELD OF INVENTION

The invention generally relates to semiconductor devices and device fabrication and, more particularly, to a trench capacitor memory cell.

BACKGROUND OF INVENTION

Integrated circuits (ICs) employ capacitors for charge storage purposes. For example, memory devices, including random access memories (RAMs) such as dynamic RAMs (DRAMs) store a charge in a capacitor. The level of the charge ("0" or "1") in the capacitor represents a bit of data.

A DRAM IC includes an array of memory cells interconnected by rows and columns. Typically, the row and column connections are referred to as wordlines and bitlines, respectively. Reading data from or writing data to the memory cells is accomplished by activating the appropriate wordlines and bitlines.

Typically, a DRAM memory cell comprises a metal oxide semiconductor field effect transistor (MOSFET) connected to a capacitor. The transistor includes a gate and first and second diffusion regions. The first and second diffusion regions are referred to either as the drain or source, respectively, depending on the operation of the transistor. For convenience, the terms drain and source are interchangeable. The gate of the transistor is coupled to a wordline, and the source is coupled to a bitline. The drain of the transistor is coupled to the capacitor or storage node. Applying the appropriate voltage to the gate switches on the transistor, forming a conductive path to the capacitor. This conductive path is closed when the transistor is switched off.

Trench capacitors are commonly employed in DRAMs. A trench capacitor is a three-dimensional structure formed into the silicon substrate. A conventional trench capacitor comprises a trench etched into the substrate. The trench is typically filled with n+ doped poly which serves as one plate of the capacitor (referred to as the storage node). The second plate of the capacitor, referred to as a "buried plate," is formed by, for example, outdiffusing n+ dopants from a dopant source into a region of the substrate surrounding the lower portion of the trench. A dielectric layer is provided to separate the two plates forming the capacitor. To prevent or reduce parasitic leakage that occurs along the upper portion of the trench to an acceptable level, an oxide collar of sufficient thickness is provided therein. Typically, the oxide collar is sufficiently thick to reduce the parasitic leakage to less than 1 fA/cell.

Continued demand to shrink devices has facilitated the design of DRAMs with greater density and smaller feature size and cell area. For example, design rules have been scaled from 0.25 microns (um) down to about 0.12 nm and below. At the smaller groundrules, the control of vertical parasitic MOSFET leakage between the storage node diffusion and the buried-plate becomes problematic due to the smaller trench dimension. This is because a smaller trench opening necessitates a corresponding reduction in collar thickness to facilitate filling of the trench. However, to reduce the parasitic leakage to below an acceptable level, the thickness of the collar needs to be about 25–70 nm, depending on operating voltage conditions. Such a thick collar hinders the filling of the smaller trench.

Another technique of reducing parasitic leakage is to increase dopant concentration of the well of the transistor. However, raising the dopant concentration increases the electric fields in the depletion regions, which results in a sharp increase in junction leakage. This is especially true when crystallographic defects are present in the silicon.

From the above discussion, it is desirable to provide a small trench capacitor with sufficiently low parasitic leakage.

SUMMARY OF THE INVENTION

The invention relates to a trench capacitor memory cell. In accordance with one embodiment, a diffusion region is provided in the substrate adjacent to the collar region. The diffusion region is self-aligned to the collar region. The diffusion region increases the gate threshold voltage of the parasitic MOSFET transistor that is created by the node diffusion, buried plate, and collar. By increasing the gate threshold voltage, a thinner collar can be employed in the capacitor while achieving a desired level of leakage.

DESCRIPTION OF THE INVENTION

The invention relates to a trench capacitor memory cell employed in an integrated circuit (IC). The IC includes, for example, a random access memory (RAM), a dynamic random access memory (DRAM), or a synchronous DRAM (SDRAM). ICs such as an application specific IC ASIC, a merged DRAM-logic circuit (embedded DRAM), or any other logic circuit are also useful.

Typically, numerous ICs are formed on the wafer in parallel. After processing is finished, the wafer is diced to separate the ICs to individual chips. The chips are then packaged, resulting in a final product that is used in, for example, consumer products such as computer systems, cellular phones, personal digital assistants (PDAs), and other electronic products.

Figure 1:
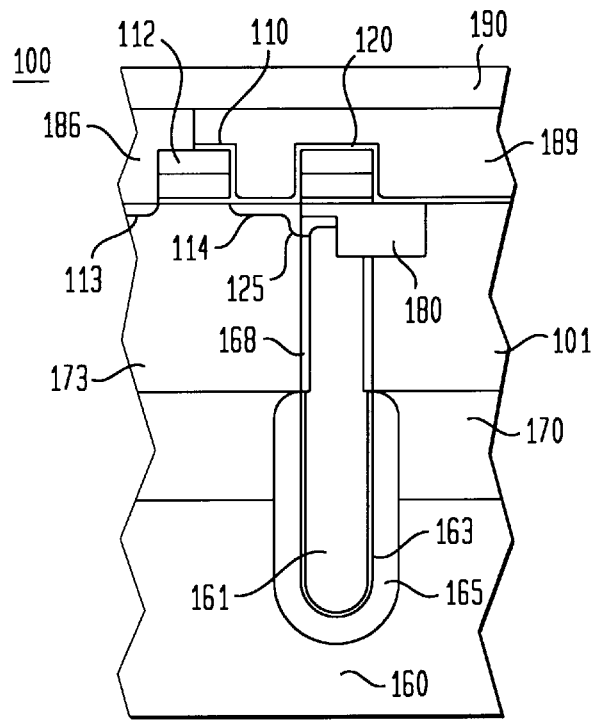
FIG. 1 shows a conventional trench capacitor DRAM cell.

Referring to FIG. 1, a conventional trench capacitor DRAM cell 100 employing an n-channel MOSFET is shown to facilitate discussion of the invention. Such conventional trench capacitor DRAM cell is described in, for example, Nesbit et al., A 0.6 $\mu m^2$ 256 Mb Trench DRAM Cell With Self-Aligned Buried Strap (BEST), IEDM 93-627, which is herein incorporated by reference for all purposes. Typically, an array of cells are interconnected by wordlines and bitlines to form a DRAM chip.

The DRAM cell 100 comprises a trench capacitor 160 formed in a substrate 101. The trench is filled with, typically, polysilicon (poly) 161 that is heavily doped with n-dopants. The poly serves as one plate of the capacitor, referred to as a "storage node." A buried plate 165 doped with n-type dopants surrounds the lower portion of the trench. In the upper portion of the trench is a collar 168 to reduce parasitic leakage. A node dielectric 163 separates the two plates of the capacitor. A buried well 170 comprising n-type dopants is provided to connect the buried plates of the DRAM cells in the array. Above the buried well is a p-well 173. The p-well provides the correct doping type and concentration for the proper operation of the low leakage N-FET.

The DRAM cell also comprises a transistor 110. The transistor includes a gate 112, a source 113, and drain 114 diffusion regions comprising n-type dopant. As previously discussed, the designation of source and drain depends on the operation of the transistor. The gate represents a wordline. Since the wordline gates the connection to the capacitor, it is typically referred to as an "active wordline". Connection of the transistor to the capacitor is achieved via a diffusion region 125, referred to as the "node diffusion."

A shallow trench isolation (STI) 180 is provided to isolate the DRAM cell from other cells or devices. As shown, a wordline 120, is formed over the trench and isolated therefrom by the STI. Wordline 120 is referred to as the "passing wordline". Such configuration is referred to as a folded bitline architecture.

An interlevel dielectric layer 189 is formed over the wordlines. A conductive layer, representing a bitline, is formed over the interlevel dielectric layer. A bitline contact opening 186 is provided in the interlevel dielectric layer to contact the diffusion 113 to the bitline 190.

As discussed previously, smaller groundrules that produce smaller trench dimensions require thinner collars to enable the filling of the trenches with poly. However, thinner collars which allows the filling of the smaller trenches may be inadequate to reduce the parasitic leakage to a desired level.

Figure 2:
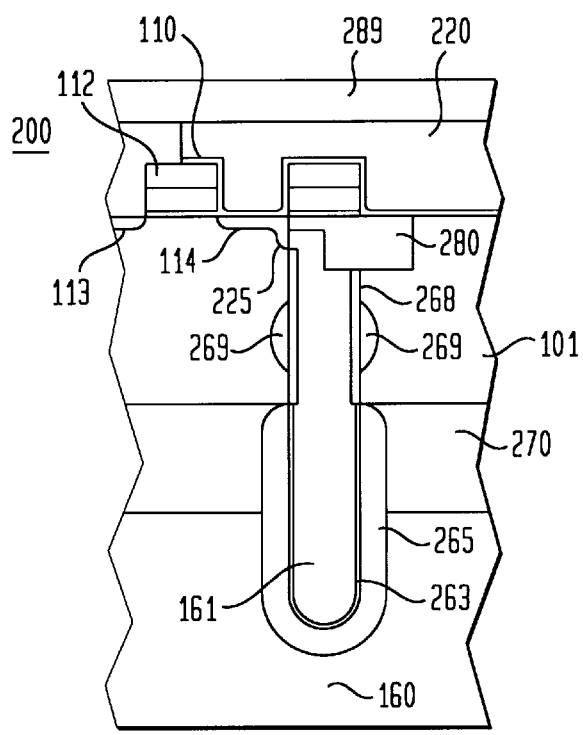
FIG. 2 shows a trench capacitor DRAM cell in accordance with one embodiment of the invention.

Referring to FIG. 2, a trench capacitor DRAM cell 200 in accordance with the invention is shown. As shown, a trench capacitor 160 is formed in a substrate 101. A storage node 161 is filled with heavily doped polysilicon (poly) having a first conductivity. In one embodiment, the first conductivity is of n-type, wherein the n-type dopants include, for example, arsenic (As) or phosphorus (P). An n-type doped buried plate 265 surrounds the lower portion of the trench. Separating the storage node and the buried plate is a node dielectric layer 263.

An n-type buried well 270 is provided below the surface of the substrate. The peak concentration of dopants in the buried n-well is at about the top of the buried plate in order to commonly connect it with the buried plates of the DRAM cells in the array. Above the buried n-well is a doped region comprising dopants having a second conductivity. In one embodiment, the second conductivity is p-type that includes dopants such as boron (B). The doped region of p-well serves to provide the proper doping of the array transistor and typically has a peak dopant concentration of about $3-8 \times 10^{17}$ cm$^{-3}$ within the well.

In the upper portion of the trench is provided a dielectric collar. The collar comprises, for example, oxide formed by the decomposition of TEOS. The collar is the gate oxide of the parasitic MOSFET between diffusion region 225 and the buried plate, forming a parasitic transistor whose gate is represented by the doped poly in the trench. Therefore, the collar is sufficiently thick in order to raise the gate threshold voltage ($V_T$) of the parasitic transistor.

In accordance to one embodiment of the invention, a diffusion region 269 is provided in the substrate adjacent to the collar region of the trench capacitor. The diffusion region comprises dopants having a conductivity opposite that of the buried plate and diffusion region 225. In one embodiment, the diffusion region 269 comprises p-type dopants such as B. The concentration of B in the diffusion region is sufficiently high to increase the $V_T$ of the parasitic transistor to effect a reduced leakage current. In one embodiment, the concentration of B is between the range of about $5 \times 10^{17}$ to $2 \times 10^{18}$ cm$^{-3}$. The diffusion region 269 enables the use of a thinner collar without resulting in a larger than desired parasitic leakage.

The DRAM cell further includes a transistor 110 comprising a gate 112, a source 113, and a drain 114. The drain and source are formed by implanting n-type dopants, such as phosphorus (P). Connection of the transistor to the capacitor is achieved via the node diffusion 225.

To isolate the DRAM cell from other devices or cells in the array, a shallow trench isolation (STI) 280 is provided. Illustratively, a passing wordline 220, which is isolated by the STI, is included over the trench to form a folded bitline architecture. Other bitline architectures such as open or open-folded are also useful.

Over the wordlines is an interlevel dielectric layer 289. The interlevel dielectric comprises, for example, doped silicate glass such as borophosphosilicate glass (BPSG). Other doped silicate glass such as phosphosilicate glass (PSG) or borosilicate glass (BSG) is also useful. Alternatively, undoped silicate glass such as TEOS may be used. A bitline is formed over the dielectric layer, contacting the source via a bitline contact opening. Access to the DRAM cell is achieved by providing the appropriate voltages to the wordline and bitline, enabling data to be written or read from the trench capacitor.

FIGS. 3a–e show a process for forming a DRAM cell in accordance with one embodiment. As described, the process forms a n-channel DRAM cell. However, those skill in the art will appreciate the process can easily be adapted to form a p-channel DRAM cell.

Figure 3A:
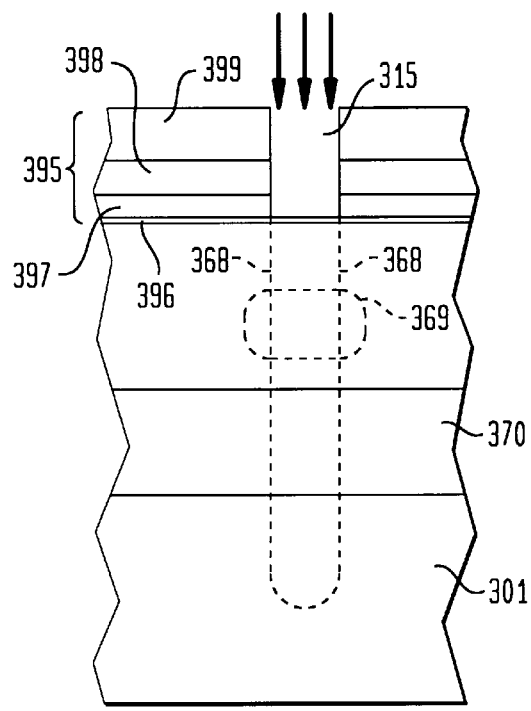
FIGS. 3a–e show a process for forming the trench capacitor DRAM cell in accordance with one embodiment of the invention.

Referring to FIG. 3a, a substrate 301 is provided on which the DRAM cell is fabricated. The substrate, for example, is a silicon wafer. Other substrates such as silicon on insulator (SOI) or other semiconductor materials are also useful. The substrate, for example, may be lightly or heavily doped with dopants of a pre-determined conductivity to achieve the desired electrical characteristics. The major surface of the substrate is not critical and any suitable orientation such as a (100), (110), or (111) is useful. In an exemplary embodiment, the substrate is lightly doped with p-type dopants (p$^-$), such as B. The concentration of the B is about $1-2 \times 10^{16}$ cm$^{-3}$. In the substrate is also formed a n-type buried well 370 comprising P or As dopants. Various techniques for forming the buried well are known. The peak concentration of the n-type dopants, which is about $1 \times 10^{17}-2 \times 10^{18}$ cm$^{-3}$, is located in the substrate region below where the bottom of the isolation collar oxide will be.

A pad stack 395 is formed on the surface of the substrate. The pad stack comprises, for example, a pad oxide layer 396, a polish stop layer 397, and a hard mask layer 398. The polish stop layer comprises, for example, nitride, and the hard mask comprises TEOS. Other material, such as BPSG, BSG, or SAUSG is also useful for the hard mask layer.

The hard mask layer is patterned using conventional lithographic techniques to define a region 315 in which the storage trench is to be formed. Such techniques include depositing a photoresist layer 399 and selectively exposing it with an exposure source and mask. Either exposed or unexposed portion of the resist, depending on whether it is a positive or negative type resist, is removed during development. As a result, the pad stack in region 315 is unprotected by the resist layer. The pad stack (hard mask, pad nitride, and pad oxide) in region 315 is then removed, exposing the silicon substrate underneath. Removal of the pad stack layers is achieved by, for example, for example, reactive ion etching (RIE).

Dopants are implanted into the substrate to increase the threshold voltage ($V_T$) of the vertical parasitic transistor, using the photoresist and pad stack layers to serve as an implant mask. The dopants that are implanted into the substrate are of the conductivity type that is opposite of that used for a buried plate. In one embodiment, the conductivity is p-type, which includes B dopants. The implant is performed with sufficient energy and dose to locate a peak concentration of the B dopants in the collar region of the trench capacitor. It is therefore possible to increase the parasitic transistor's $V_T$, which results in reducing the parasitic leakage to a desired level. The parasitic leakage is reduced to less than or equal to 1 fa/cell. In one embodiment, the energy and dose is about 200–350 keV at about $1.5-3.5 \times 10^{13}$ cm$^{-2}$ and preferably about 220–300 keV at about $1.5-2.5 \times 10^{13}$ cm$^{-2}$. As such, the parasitic transistor's $V_T$ adjust implant is advantageously self-aligned. That is, the $V_T$ implant uses the pad stack as an implant mask, thus requiring no additional lithographic steps to form the diffusion region.

After implantation, the resist layer is removed. The substrate is then annealed sufficiently long to diffuse the B dopants laterally out of the trench region, forming diffusion region 369. As can be seen, the diffusion region 369 extends laterally beyond the vertical dotted lines 368 that represent the trench sidewall profile. The portions of the diffusion region that extend beyond the dotted line are used to increase the $V_T$ of the parasitic transistor. The anneal is sufficient to drive the dopants about 20–150 nm from the sidewall (depicted by dotted line 368). Typically, the anneal is about 850–950° C. for about 1–10 min., preferably about 850° C. for about 5 min. The use of rapid thermal anneal (RTA) is also useful.

Figure 3B:
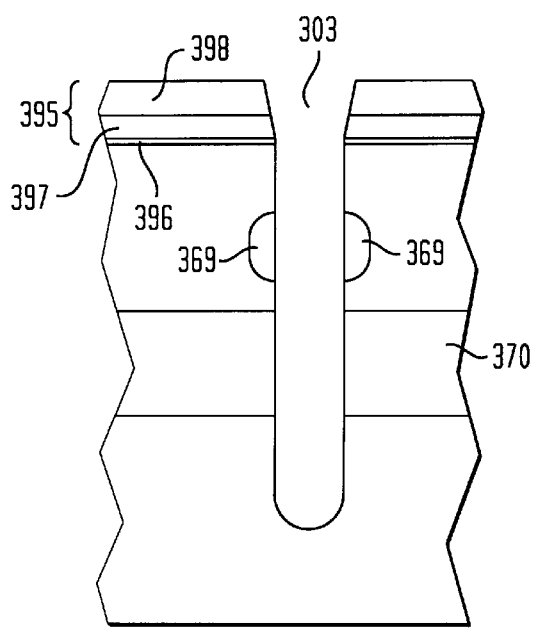

Referring to FIG. 3b, the process for forming the trench capacitor DRAM cell continues, using conventional techniques. Such techniques are described in, for example, Nesbit et al., A 0.6 $\mu$m$^2$ 256 Mb Trench DRAM Cell With Self-Aligned Buried Strap (BEST), IEDM 93-627, which is already incorporated by reference. An anisotropic etch, such as RIE, is performed, using the pad stack as a RIE mask. The RIE removes the substrate material to form the deep trench 303. As shown, diffusion regions 369 remain in the substrate region where the collar is to be formed. Since the region of the substrate where the ions are implanted are removed by the RIE, there is no concern with implant damage in the active region of the device. As such, the implant does not adversely impact buried strap junction leakage, as would a blanket implant which creates silicon defects.

Figure 3C:
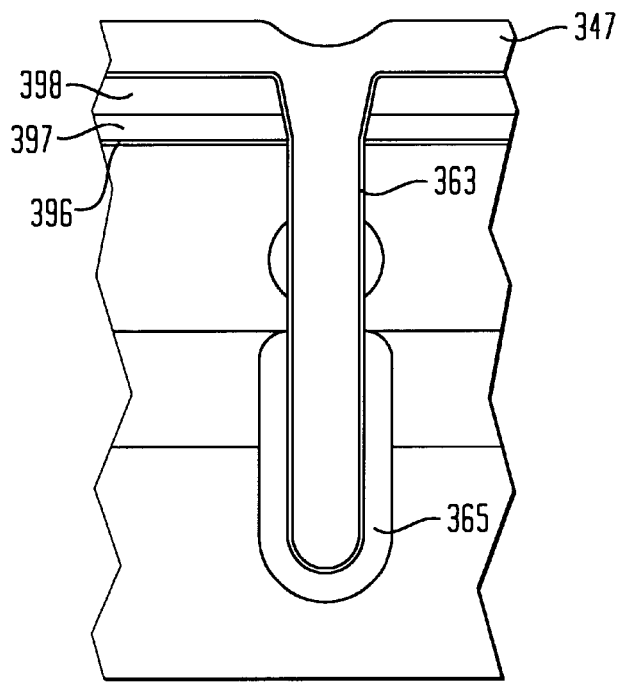

Referring to FIG. 3c, an n-type buried plate 365 is formed. The buried plate is formed by, for example, providing a dopant source and outdiffusing dopants into the substrate. This includes lining the trench with a layer of arsenic silicate glass (ASG) as the dopant source. A thin layer of TEOS is formed over the ASG. The TEOS ensures adhesion of the resist that fills the trench. The trench is then filled with resist. The resist is subsequently recessed, exposing the ASG layer in the upper portion of the trench. The exposed ASG is removed by a wet etch process. The remaining portion of the resist is removed from the trench selective to the ASG. A dielectric layer comprising, for example, TEOS is deposited over the trench. The TEOS layer prevents As from autodoping the exposed upper portion of the silicon sidewalls. An anneal is performed to outdiffuse the As from the ASG into the silicon, creating a buried plate 365. Other techniques of forming the buried plate are also useful.

A dielectric layer 363 is formed over the surface of the wafer, covering the interior of the trench. The dielectric layer serves as the node dielectric used to separate the plates of the capacitor. In one embodiment, the dielectric layer comprises a deposited nitride followed by oxidation. The nitride layer is formed by, for example, CVD in an FTP tool. Thereafter, a thermal oxide is grown at a temperature of about 900° C.

The use of a nitride/oxide (NO) layer improves the quality of the node dielectric. A heavily n-type doped poly 347 is then deposited, filling the trench and covering the surface of the substrate.

Typically, the surface of the substrate is planarized down to node dielectric layer, providing a co-planar surface with it and the poly. The node dielectric and hard mask layer on the surface of the substrate are then removed using a wet etch. The wet etch is selective to nitride and poly, leaving a poly stud protruding above the pad nitride layer. The poly is then polished by, for example, chemical mechanical polish (CMP) down to the pad nitride layer.

Figure 3D:
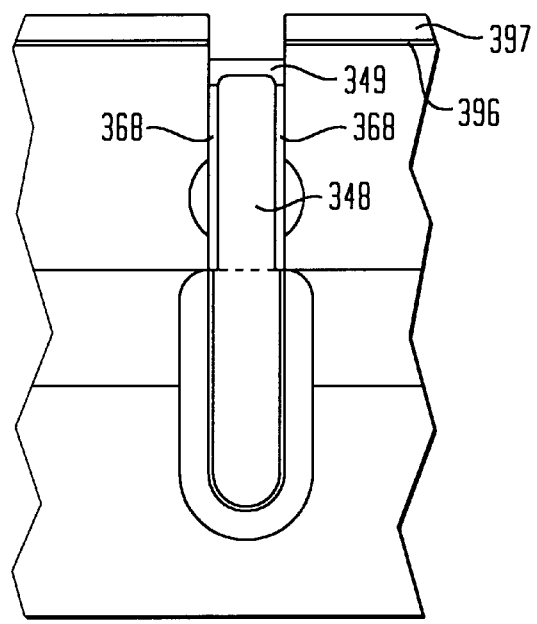

Referring to FIG. 3d, a RIE selective to nitride is performed to recess the poly in the trench. The poly is recessed to the bottom of where the collar will be. Subsequently, the node dielectric layer is removed by a wet etch. The wet etch is selective to silicon. As such, the node dielectric layer is removed without removing the poly.

A dielectric layer is formed over the surface of the substrate and the trench. In one embodiment, the dielectric layer is formed by first growing a thin layer of thermal and then depositing a layer of TEOS thereover. The dielectric layer is etched by, for example, an RIE. The RIE removes the dielectric layer from the surface pad nitride stack and the bottom of the recess, exposing the doped poly. The dielectric layer remains on the silicon sidewall to form a collar 368. Due to the presence of the diffusion region 369, the dielectric layer need not be as thick to reduce the parasitic leakage to a desired level. For example, the dielectric collar may be about 15–25 nm thick.

A second layer of n-type heavily doped poly 348 is deposited, filling the trench and surface of the substrate. A CMP is performed to provide a co-planar surface with the poly 348 and pad nitride layer 397. The poly is then recessed selective to the nitride and oxide. The depth of the recess is sufficient to enable the formation of a buried strap above the doped poly 348. Thereafter, the top portion of the oxide collar is recessed to enable diffusion of dopants from the doped poly into the substrate. A layer of intrinsic poly is then deposited over the surface of the substrate, covering the pad nitride and filling the trench. The poly is then polished and recessed by an RIE to form a buried strap 349.

Figure 3E:
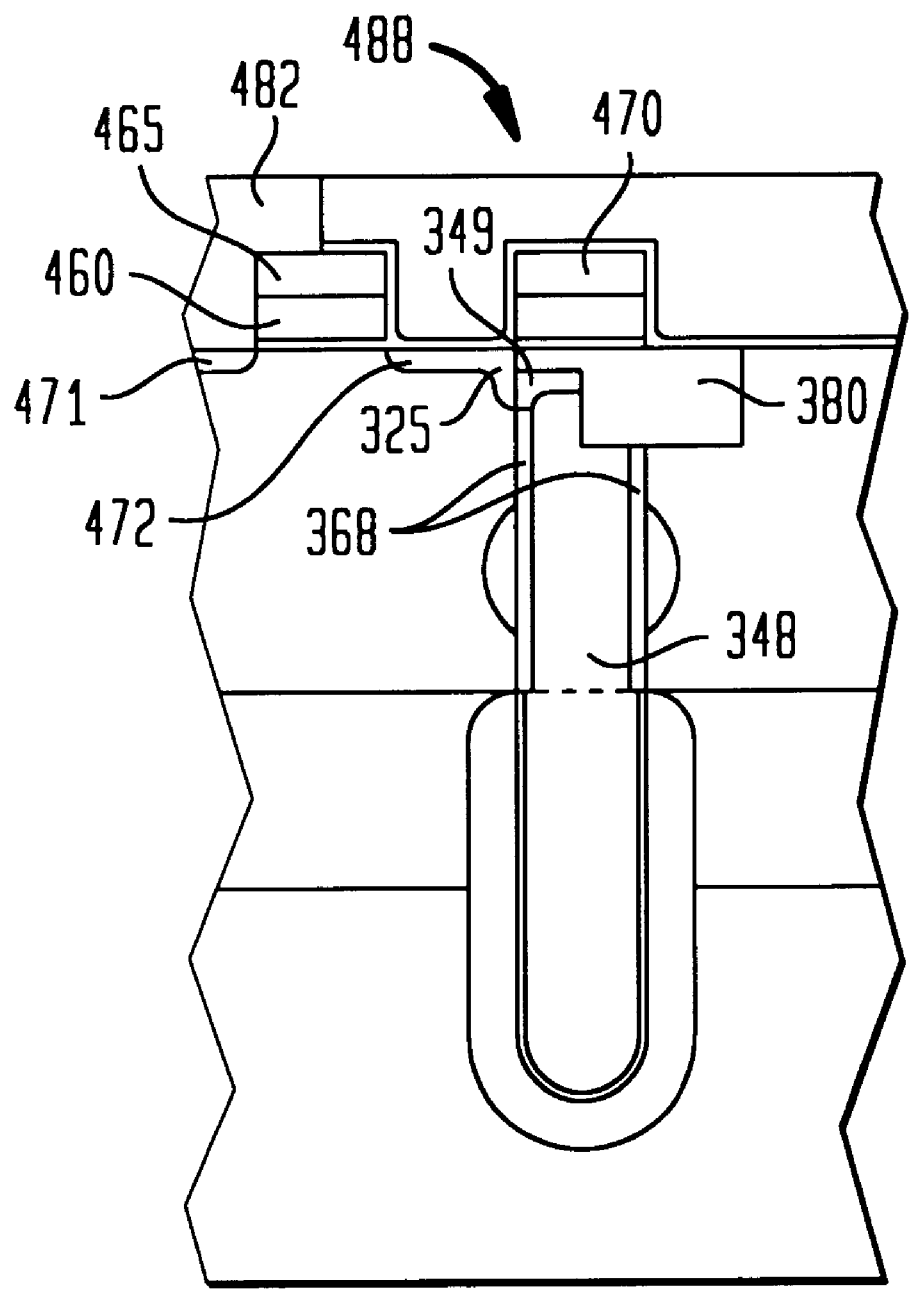

Referring to FIG. 3e, the active area of the DRAM cell is defined. The nonactive region of the cell is then anisotropically etched by, for example, an RIE, providing a shallow trench for the STI 380. As shown, the shallow trench overlaps about ≦half the trench, preferably it should overlap about half the trench. The shallow trench is then filled with a dielectric material comprising, for example, SiO2 such as TEOS. A nitride liner may be provided to line the shallow trench to prevent oxygen from diffusing into the silicon and poly sidewalls. The dielectric material may be annealed to densify it. The anneal also outdiffuses dopants from the doped poly in the trench through the strap 349 to form diffusion region 325.

An oxide layer is formed on the surface of the wafer. The oxide layer, referred to as a "gate sacrificial layer", serves as a screen oxide for subsequent implants. A p-type well for the n-channel access transistor of the DRAM cell is then formed. To form the p-well, a resist layer is deposited on top of the oxide layer and appropriately patterned to expose the p-well region. As shown, p-type dopants, such as boron (B) are implanted into the well region. The dopants are implanted sufficiently deep to prevent punchthrough and to reduce sheet resistance. The dopant profile is tailored to achieve the desired electrical characteristics, e.g., gate threshold voltage ($V_T$).

In addition, p-type wells for n-channel support circuitry are also formed. For complimentary wells in complimentary metal oxide silicon (CMOS) devices, n-wells are formed. Formation of n-type wells require additional lithographic and implant steps for defining and forming the n-type wells. As with the p-type wells, the profile of the n-type wells are tailored to achieve the desired electrical characteristics of the PFETs. After the wells have been formed, the gate sacrificial layer is removed.

The various layers of the access transistor are formed on the substrate surface. This includes a gate oxide layer, a n-doped poly layer, and a nitride layer that serves as an etch stop. Alternatively, the poly layer may include a polycide layer that comprises a silicide layer over a poly layer. Various metal silicides, such as $WSi_x$, can be used. These layers are then patterned to form a gate stack 465 for a transistor 460 of the DRAM cell. A passing gate stack 470 is typically formed over the trench and isolated therefrom by the STI. Drain 472 and source 471 are formed by implanting n-type dopants such as P or As. In one embodiment, P is implanted into the source and drain regions. The dose and energy is chosen to produce a dopant profile which achieves the desired operating characteristics, such as minimizing short channel effects and junction leakage. To improve diffusion and alignment of the source and drain to the gate, nitride spacers (not shown) may be employed. To connect the transistor to the trench, a node junction 325 is created by outdiffusing dopants through the strap 349.

A dielectric layer 488 is formed over the wafer surface, covering the gates and substrate surface. The dielectric layer, for example, comprises BPSG. Other dielectric layers, such as TEOS are also useful. As shown, a borderless contact opening 482 is etched to expose the source 471. The contact opening is then filled with a conductive material, such as n+doped polysilicon, forming a contact stud therein. A metal layer, representing a bitline, is formed over the dielectric layer, making contact with the source via the contact stud.

In an alternative embodiment, a non-self aligned process is used to form the diffusion region that increases the $V_T$ of the parasitic MOSFET in order to reduce vertical parasitic leakage. The non-self aligned process, for example, includes forming a photoresist layer on the surface of the substrate prior to the formation of the pad stack. The resist is selectively exposed with an exposure source and the mask that for example, defines the trenches used to form trench capacitors. Portions of the resist are removed after development, exposing the substrate surface in regions where the trenches are to be formed. The substrate is then implanted with the appropriate dopants, dose, and energy to achieve the desired profile. The resist is removed after the implant. An anneal is performed, causing the dopants to diffuse and expanding the diffusion region as desired. Thereafter, a pad stack is formed on the surface of the substrate and processing continues to form the trench capacitor memory cells.

While the invention has been particularly shown and described with reference to various embodiments, it will be recognized by those skilled in the art that modifications and changes may be made to the present invention without departing from its scope. The scope of the invention should therefore be determined not with reference to the above description but with reference to the appended claims along with their full scope of equivalents.

We claim:

1. A method of fabricating a semiconductor memory comprises the steps of:

providing a substrate with a trench;

forming a capacitor in the trench, the capacitor including a dielectric collar formed within a collar region adjacent to the trench, a buried diffusion region surrounding a lower portion of the trench and a node formed within the trench;

forming a transistor having a gate, a first diffusion region and a second diffusion region in the substrate, one of the first and second diffusion regions being coupled to the node by a node diffusion; and forming a third diffusion region in the substrate extending laterally outward from within the trench and disposed adjacent to the collar by doping the collar region with dopants having a conductivity opposite of the buried diffusion region and the node diffusion, wherein the dopants include Boron having a concentration of between about $5 \times 10^{17}$ to $2 \times 10^{18}$ $cm^{-3}$, the third diffusion region comprising a dopant concentration sufficient to increase a gate threshold voltage of a parasitic transistor formed between the buried diffusion region and the node diffusion, so as to reduce leakage.

2. The method of fabricating a semiconductor memory as recited in claim 1, wherein the leakage is reduced to less than or equal to 1f amps.

3. The method of fabricating a semiconductor memory as recited in claim 1, wherein the step of forming the third diffusion region is performed by a self-aligned process.

4. The method of fabricating a semiconductor memory as recited in claim 1, wherein the step of forming the third diffusion region is performed by a non-self-aligned process.

5. A method of fabricating a semiconductor memory comprises the steps of:

providing a substrate having a pad stack formed thereon;

etching an opening through the pad stack;

doping the substrate such that a peak concentration is located within a collar region located within the substrate, implanting the dopants at an energy between about 200 keV to about 350 keV at a dose of between about $1.5 \times 10^{13}$ $cm^{-2}$ to about $3.5 \times 10^{13}$ $cm^{-2}$;

annealing the substrate to diffuse the dopants laterally outward from the collar region to form a third diffusion region;

etching a trench through the collar region of the substrate;

removing the pad stack;

forming a capacitor in the trench, the capacitor including a collar formed within the collar region adjacent to the trench, a buried diffusion region surrounding a lower portion of the trench and a node within the trench;

forming a transistor having a gate, a first diffusion region and a second diffusion region in the substrate, one of the first and second diffusion regions being coupled to the node by a node diffusion;

reducing leakage from a parasitic transistor by providing the third diffusion region which comprises a dopant concentration sufficient to increase a gate threshold voltage of the parasitic transistor formed between the buried diffusion region and the node diffusion.

6. The method of fabricating a semiconductor memory as recited in claim 5, wherein the step of doping the substrate further comprises the step of providing dopants having a conductivity opposite of the buried diffusion region and the node diffusion.

7. The method of fabricating a semiconductor memory as recited in claim 6, wherein the dopants include Boron having a concentration of between about $5 \times 10^{17}$ to about $2 \times 10^{18}$ $cm^{-3}$.

8. The method of fabricating a semiconductor memory as recited in claim 5, wherein the step of reducing leakage includes reducing leakage to less than or equal to 1f amps.

9. The method of fabricating a semiconductor memory as recited in claim 5, wherein the step of annealing the substrate further comprises annealing the substrate for between about 1 minute to about 10 minutes at about 850° C. to about 950° C.

10. The method of fabricating a semiconductor memory as recited in claim 5, wherein the step of removing the pad stack includes removing the pad stack using reactive ion etching.

11. The method of fabricating a semiconductor memory as recited in claim 5, wherein the third diffusion region is formed by a self-aligned process.

12. The method of fabricating a semiconductor memory as recited in claim 5, wherein the third diffusion region is formed by a non-self-aligned process.

* * * * *